US005477057A

United States Patent [19]
Angeley et al.

[11] Patent Number: 5,477,057
[45] Date of Patent: Dec. 19, 1995

[54] OFF AXIS ALIGNMENT SYSTEM FOR SCANNING PHOTOLITHOGRAPHY

[75] Inventors: David Angeley, Bridgeport; Stan Drazkiewicz; Gregg Gallatin, both of Newtown, all of Conn.

[73] Assignee: SVG Lithography Systems, Inc., Wilton, Conn.

[21] Appl. No.: 292,096

[22] Filed: Aug. 17, 1994

[51] Int. Cl.⁶ ................................................. G01N 21/86
[52] U.S. Cl. .......................... 250/548; 250/557; 356/401
[58] Field of Search ............................ 356/401; 250/548, 250/557

[56] References Cited

U.S. PATENT DOCUMENTS

| | | | |
|---|---|---|---|
| 4,504,148 | 3/1985 | Kuroki et al. | 250/557 |
| 4,545,683 | 10/1985 | Markle. | |
| 4,549,084 | 10/1985 | Markle. | |
| 4,578,590 | 3/1986 | Wu. | |
| 4,579,453 | 4/1986 | Makita | 250/548 |
| 4,697,087 | 9/1987 | Wu. | |

Primary Examiner—Edward P. Westin
Assistant Examiner—Jacqueline M. Steady
Attorney, Agent, or Firm—Fattibene and Fattibene; Paul A. Fattibene

[57] ABSTRACT

The invention described herein is an alignment system used in semiconductor manufacturing. It is the core component used to align a mask containing a circuit pattern to a wafer during a scanning sequence. The alignment system images an alignment reticle pattern onto a wafer which contains alignment marks. During scanning, the light from the alignment reticle image is reflected and scattered by the wafer and its alignment marks. Multiple detectors are placed at a pupil plane of the alignment system to collect the reflected and scattered light in the bright-field and dark-field regions. The resulting signals and their analysis results in determination of accurate alignment of a wafer. The alignment system does not use or "look through" the projection optics of the scanning photolithographic device. The broadband spectrum used for alignment illumination cannot be used in the projection optics designed for the deep UV wavelengths without undesirable results. The broadband spectrum illumination utilized in the alignment system results in improved detection of wafer alignment marks independent of the various process wafer structures that can be encountered.

23 Claims, 6 Drawing Sheets

OFF AXIS ALIGNMENT SYSTEM FOR SCANNING PHOTOLITHOGRAPHY

FIELD OF THE INVENTION

The present invention relates generally to semiconductor manufacturing, and more specifically to an alignment system used in a scanning photolithographic production tool.

BACKGROUND OF THE INVENTION

The manufacture of semiconductor circuits is primarily accomplished with photolithographic techniques. During this manufacturing process, multiple layers of a circuit pattern are built up on a semiconductor wafer. This is accomplished by projecting an image of a mask containing the circuit pattern onto a wafer coated with a photosensitive compound known generally as photoresist. The feature sizes of the circuit patterns formed on the semiconductor wafer are typically in the range of 0.50 microns or smaller. Due to these extremely small feature sizes and the requirement to expose multiple layers as part of the process in forming the semiconductor chip, the use of an alignment system to align the mask image to the semiconductor wafer to an accuracy better than 0.1 micron is required.

One such alignment system is disclosed in U.S. Pat. No. 4,697,087 entitled "Reverse Dark Field Alignment System for Scanning Lithographic Aligner" issued to Frederick Y. Wu on Sept. 29, 1987, which is herein incorporated by reference. Therein disclosed is an alignment system wherein, a wafer having a wafer target thereon, and a mask having a mask target thereon, are aligned with respect to each other. The alignment system has two optical channels, or arms, used to detect alignment targets in scribe alleys above and below the mask pattern being imaged on the semiconductor wafer. A portion of the light path used in the two optical channels, or arms, is through the projection optics used to image the mask containing the circuit patterns thereon onto the wafer. This system is referred to as an off-axis through-the-lens alignment system. While the off-axis through-the-lens alignment system has several advantages, its nature and inherent complexity lead to several deficiencies that are outlined below.

During an overlay alignment sequence the photosensitive resist coating wafer cannot be exposed. The deep ultraviolet, or UV, actinic wavelengths used to expose the photosensitive resist coating therefore cannot be used by the off-axis through-the-lens alignment system. The off-axis through-the-lens alignment system uses non-actinic, visible wavelength, narrow band laser light. Because the projection optics are designed to perform optimally at the photolithographic actinic wavelengths (i.e. the deep UV), the projection optics' performance at the off-axis through-the-lens alignment system's visible wavelengths is somewhat compromised. The alignment system therefore requires corrections due to color aberrations of the projection optics at the alignment system's visible wavelengths compared to the actinic UV wavelengths. These adjustments for color aberrations must be periodically recalibrated at the different optical alignment channel or arm positions.

Additionally, the off-axis through-the-lens alignment system's use of narrow band laser light results in a wide variation in alignment signal strength and shape depending on the wafer surface and coating characteristics. Wafer characteristics, such as the number, thickness, and type of surface layers, vary depending upon the process required to achieve the final product. The variation in alignment signal as a function of these process variations is referred to as process sensitivity. Process sensitivity for the off-axis through-the-lens alignment system is exacerbated by the use of laser light because of the potential for interference effects caused by the layer structure covering the wafer alignment marks.

Therefore, there is a need for an alignment system that can operate independent of the projection optics. This allows both the projection optics and the alignment system to be optimized independently with no compromise between the two systems. In particular, this separation enables the alignment system to be designed such that no calibration or adjustment is needed for color correction as in the through-the-lens alignment system. It allows the alignment system to be designed to work with broadband light to eliminate the interference effects and thus reduce process sensitivity. Additionally, the need for a simpler less expensive alignment system that is accurate, reliable and easily maintained can be more easily achieved by bypassing the projection optics. The use of projection optics as part of the alignment system increases the cost and complexity, as well as the required maintenance while potentially reducing the reliability of the photolithographic scanner.

SUMMARY OF THE INVENTION

The present invention is an essential component involved in the alignment sequence, performed on a scanning photolithographic production tool, which results in the accurate alignment of a mask with a circuit pattern thereon to a semiconductor wafer with a pre-existing pattern thereon. The present invention is an alignment system that is mounted adjacent to the projection optics. The present invention uses a broadband light source to illuminate an alignment reticle having a predetermined pattern thereon. Optics are used to image the alignment reticle pattern into the wafer plane. The imaged light is reflected and scattered by the alignment marks on the wafer as the wafer is scanned past the stationary alignment reticle image. The reflected and scattered light is collected by the imaging optics and directed via a beamsplitter to a pupil plane. Detectors are placed at the pupil plane in distinct regions. These regions, providing separate detection, correspond to specific angular distributions (i.e. numerical apertures or NA's) of the reflected and scattered light at the wafer. Namely, the pupil is divided into a central region which collects reflected light corresponding to the alignment reticle imaging NA (i.e. bright-field) and four outer regions which collect light scattered beyond the alignment reticle imaging NA (i.e. dark-field). These four outer regions further distinguish between the light scattered to the left and right (i.e. plus and minus NA) of the central reticle imaging NA.

Accordingly, it is an object of the present invention to improve the alignment accuracy between a wafer and mask in a scanning photolithography system.

It is an object of the present invention to have an alignment system independent of the lithographic actinic projection optics used to image the circuit patterns.

It is another object of the present invention to provide a better alignment accuracy independent of the layer structure characteristics such as number, thickness, and type of layers covering the wafer alignment mark. That is, it is an object of the invention to reduce process sensitivity.

It is a feature of the present invention that a broadband light source can be used.

It is a feature of the present invention that the alignment system optics that image the broadband illuminated alignment reticle to the wafer plane can be well corrected for aberrations including axial and lateral color, astigmatism, spherical, and field curvature, and well corrected for asymmetric aberrations such as coma and its also be higher order variations.

It is a feature that the present invention exhibits useful alignment signals over a large depth of focus.

It is a feature of the present invention that the alignment system be telecentric at the wafer.

It is a feature of the present invention that separate detectors are used to detect reflected and scattered light corresponding to bright-field and dark-field wafer plane numerical apertures.

It is a feature of the present invention that the dark-field region is further divided into detection regions that collect light scattered to the left and right (i.e. plus and minus NA) of the central reticle imaging NA.

It is a feature of the present invention that the components that produce heat are separated from the temperature sensitive projection optics and wafer stage.

It is a feature of the present invention that, in alignment signal generation optical path, there is a uniform intensity distribution, simultaneously, at both the image and pupil planes.

It is a feature of the present invention that the alignment signal light source can be replaced at regular intervals without the need to re-align or calibrate the alignment system.

It is a feature of the present invention that it can be switched between two modes of operation. An automatic mode which generates alignment signals and a manual mode which produces a TV monitor image of the wafer.

It is an advantage of the present invention that it is less complex, is easier to align and integrate, has reduced need for calibration, adjustment, and maintenance, has lower cost, and better reliability than the off-axis through-the-lens alignment system.

These and other objectives, advantages, and features will become readily apparent in view of the following detailed description.

DETAILED DESCRIPTION OF THE PREFERRED EMBODIMENT

Figure 1:
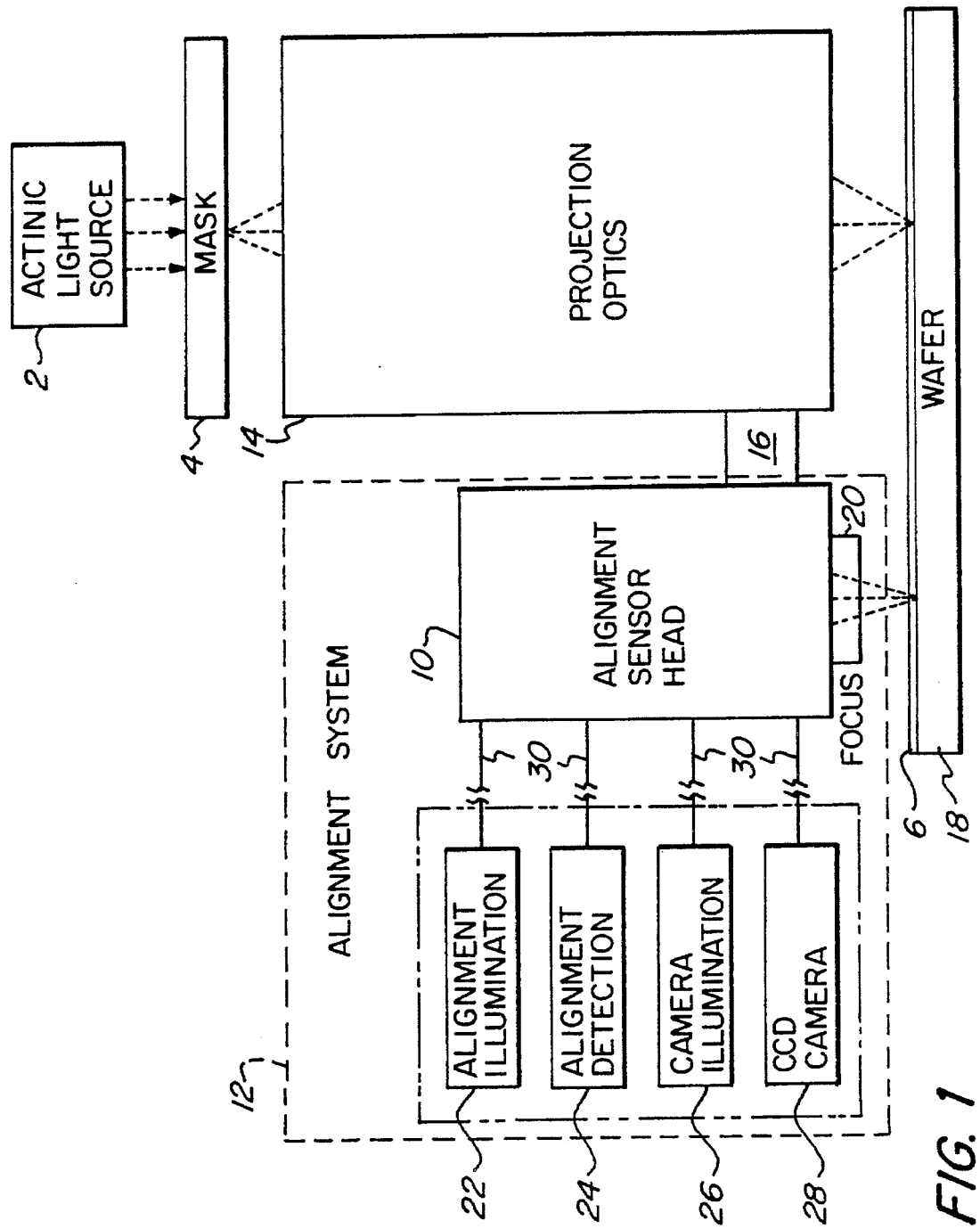
FIG. 1 is a block diagram of the major components associated with the present invention.

FIG. 1 is a block diagram of the main components that make up the present invention. The alignment sensor head 10 of the alignment system 12 is attached to the ultraviolet, or UV, projection optics 14 using mount 16. As indicated in FIG. 1, the alignment system 12 is independent from the optical path of the scanning photolithographic exposure system comprised of the actinic light source 2, the mask 4, and the projection optics 14. The projection optics 14, operating at the actinic wavelengths, images the mask 4, which contains the circuit pattern, onto the wafer 18, which is coated with photosensitive resist 6. The mount 16 allows the alignment sensor head 10 to be focused and tilted with respect to the substrate or wafer 18 as part of the initial set up and integration of the alignment system onto the exposure tool. A focus subsystem 20 is attached to the alignment sensor head 10. The focus subsystem 20 utilizes capacitance gauges to maintain wafer focus with respect to the alignment sensor head 10 during an alignment scan. A detailed description of the focus subsystem 20 is not within the scope of this invention description. The remaining subsystems of the alignment system 12 include: alignment illumination 22, alignment detection 24, camera illumination 26, and CCD camera 28. These are remotely located via fiber optics 30. Remotely locating these subsystems removes heat sources from the temperature sensitive projection optics 14 and wafer 18 and adds to the degree of modularity which enables the invention to be serviceable, maintainable, and retro-fitable. A detailed description of the alignment system 12 including the subsystems; alignment sensor head 10, alignment illumination 22, alignment detection 24, camera illumination 26 and CCD camera 28 follows.

Alignment Signal Generation

Figure 2:
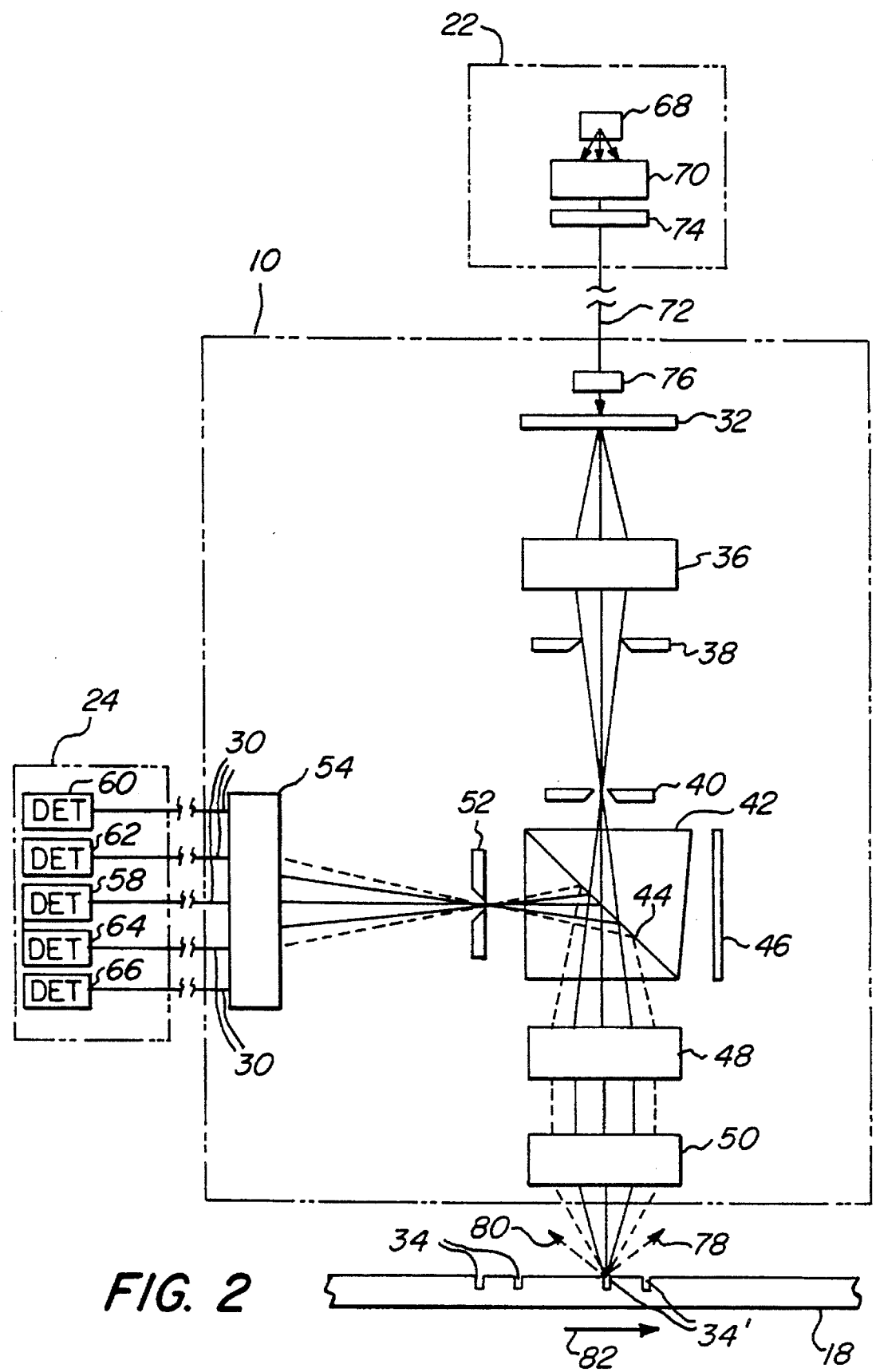
FIG. 2 is a schematic of the alignment signal generation path of the present invention featuring the alignment sensor head, the alignment illumination, and the alignment detection sub-systems.

FIG. 2 schematically illustrates the components of the present invention that generate the alignment signals. It includes the following subsystems; alignment sensor head 10, alignment illumination 22 and alignment detection 24.

The alignment sensor head subsystem 10 is the key component of the alignment system 12 and, in particular, for the generation of alignment signals from which ultimately overlay registration is achieved. Broadband light from the alignment illumination system 22 is used to illuminate a pattern 32 which is imaged onto a semiconductor wafer 18 containing alignment marks 34 and 34'. The broadband illumination source 68 has a usable continuous spectrum of light with wavelengths from 400 nm to 700 nm. At a minimum, four wavelengths of light should be used to provide broadband equivalency, spaced over a range of not less than 100 nanometers. Laser light may be used for the illumination.

The light is directed through the reticle 32 which contains a predetermined pattern thereon, permitting a portion of the light to go therethrough. Optics 36 image the light through an aperture stop 38 to an intermediate image plane and field stop 40 location. The optics 36 provide magnification such that the reticle 32 can be sized to be reasonably manufactured. The aperture stop 38 sets the NA of the light incident upon the wafer 18 to be 0.25. The field stop 40 is used as a baffle to eliminate stray or other unwanted light.

After the field stop 40, the light passes through a beamsplitter 42. The hypotenuse 44 of the beamsplitter 42 has a broadband, angle insensitive, nominal 50% transmissive/50% reflective coating that can be either metallic, dielectric, or a combination of both. Because the beamsplitter 42 is nominally 50/50, half the light is lost as a reflection. This unwanted reflected light is blocked and absorbed by the beam block 46.

Upon passing through the beamsplitter 42, the light is incident upon optics 48 and 50 which re-image the intermediate image to the wafer 18 plane. The imaged light at the wafer 18 plane is reflected and scattered by the wafer 18 and alignment marks 34 and 34'. The reflected and scattered light is collected by optics 48 and 50 and directed toward beamsplitter 42. Beamsplitter 42 reflects the light towards the intermediate image plane and field stop 52 location. The field stop 52 is placed at the intermediate image plane to act as a baffle to eliminate unwanted light that may arise from the beamsplitter and other surfaces. After the field stop 52, the light becomes incident onto a detection mask 54 which is in a pupil plane location.

Because optics 42, 48 and 50 work in both the imaging and collection paths they must be able to accommodate dual functions. Namely, these optics 42, 48, and 50 provide a well corrected image of the reticle 32 for a wafer plane NA of 0.25 while at the same time collect the high NA of 0.7 of the scattered light from the wafer 18. Additionally, because the image at the wafer 18 plane is telecentric, the pupil is located at an inaccessible location near the optic 50. Optic 48 reimages the pupil and along with the beamsplitter 42 provides access to two pupil planes. One at which the imaging NA is set by aperture stop 38, and the other at which the detection mask 54 is placed.

The alignment detection subsystem 24 determines the angular distribution of the reflected and scattered light at the wafer 18 plane that will be detected and converts the detected light to electrical signals. These electrical signals are processed to determine the time at which alignment marks 34 and 34' pass by the projected alignment reticle pattern, thereby, allowing subsequent determination of their location. The subsystem consists of a detection mask 54 which is divided into five distinct regions which collect light. Each region is connected to a remote detector for a total of five detectors 58, 60, 62, 64, 66. There is one central bright field region detector 58 which collects light reflected by the wafer 18. The detector 58 associated with this region is preferably a photodiode. The four outer dark-field region detectors 60, 62, 64, 66 detect light scattered from wafer alignment marks 34 and 34'. Because the magnitude of the scattered light can be small, the associated dark-field detectors 60, 62, 64, 66 are preferably photomultiplier tubes. The light is transferred from the mask 54 to the detectors 60, 62, 64, 66 via a fiber optic cable 30. The fiber optic cable 30 is comprised of five fiber optic bundles, each of which has a number of individual fibers randomly (incoherently) matched from end to end.

The alignment illumination subsystem 22 provides the light used to generate alignment signals. The subsystem consists of a broadband source 68 which is imaged by optics 70 onto the end of a fiber bundle 72. A dielectric glass filter 74 is used to pass the visible (400 nm to 700 nm) part of the light source spectrum, while reflecting the unwanted light source heat (IR radiation greater than 700 nm) and absorbing the UV (less than 400 nm). The light source 68 is in a housing 22 which enables the light source 68 to be translated in three perpendicular axes and facilitates lamp replacement and alignment/optimization. The fiber bundle 72 which consists of a number of individual fibers randomly (incoherently) matched from end to end, transfers the broadband visible light to the alignment sensor head 10. The light emerging from the bundle 72 is first incident upon a light diffusing glass 76. The combination of the diffusing glass 76 with the incoherent fiber bundle provides spatially incoherent illumination of the reticle 32 and ensures uniform intensity distribution across both the reticle 32 and aperture stop 38 of the alignment sensor head 10.

Figure 3:
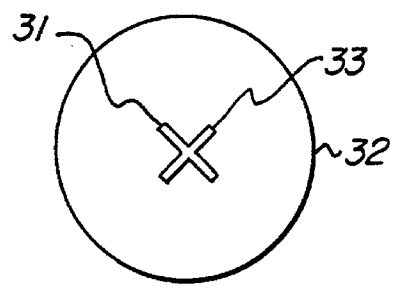
FIG. 3 is a plan view of the alignment reticle.
Figure 4:
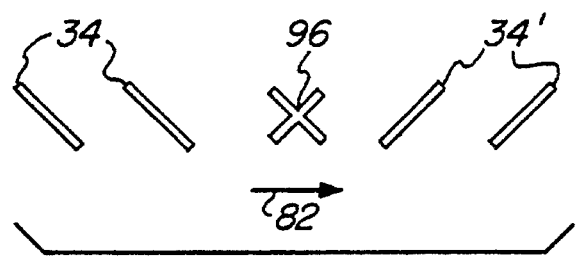
FIG. 4 is a plan view of the wafer alignment marks and the alignment reticle image in the wafer plane.
Figure 5:
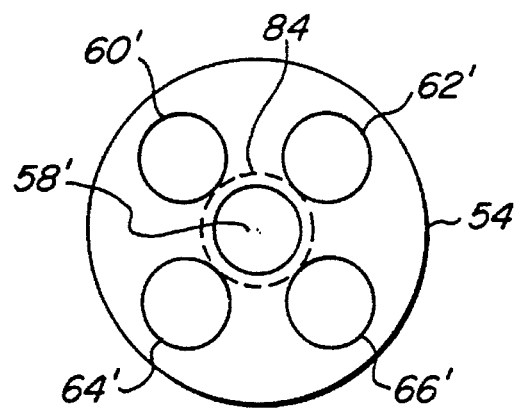
FIG. 5 is a plan view of the pupil plane detector mask.

FIGS. 3, 4 and 5 describe the details of the components that determine the characteristics of the alignment signals as the wafer 18 is scanned relative to the stationary image of the reticle 32. FIG. 3 illustrates the reticle 32 consisting of a transmissive cross pattern in an opaque field. The cross is made up of two segments 31 and 33. The two segments 31, 33 are of equal length and width and are orthogonal to each other.

FIG. 4 illustrates the wafer plane alignment marks 34, 34' as they would appear on a semiconductor wafer 18. The alignment marks 34, 34' are categorized according to their orientation. Plus wafer alignments marks 34' are oriented with a positive slope in the x-y plane as illustrated in FIG. 4, and minus alignment marks 34 are oriented with a negative slope in the x-y plane. As seen in FIG. 4, the reticle image 96 is oriented such that the segments 31 and 33 of the cross lie parallel to the minus and plus alignment marks 34 and 34', respectively.

FIG. 5 illustrates the detector mask 54. The detector mask 54 contains five separate transmission regions 58', 60', 62', 64', 66' in an opaque field. These five regions 58', 60', 62', 64', 66' correspond to the five detectors 58, 60, 62, 64, 66. The central region 58' collects reflected light from the wafer. The other regions 60', 62', 64' and 66' detect scattered light and are located around the central region in the orientation shown in FIG. 5.

Referring to FIGS. 4 and 5, when the reticle image 96 is not coincident with a wafer 18 plane alignment mark 34 or 34', the imaging light is specularly reflected by the flat wafer into an NA equal to that of the incident imaging light. The central bright-field region 58' of the detection mask 54 is sized to collect light corresponding to a wafer plane NA of 0.25. When the reticle image 96 is coincident with alignment marks 34, 34', though, some of the imaging light is scattered beyond the angles corresponding to the central bright field region 58'. The dark-field regions 60', 62', 64', 66' of the detection mask 54 collect a portion of this scattered light. The geometry of each region determines the wafer plane angular distribution of the collected scattered light. The amount of light scattered into each of the dark-field regions 60', 62', 64', 66' depends upon the orientation of the alignment marks 34, 34', the structure of the alignment marks 34, 34', and the characteristics of the layers covering the alignment marks 34, 34'. In the present invention, the dark-field regions 60', 62', 64', 66' correspond to wafer 18 plane NA between 0.35 to 0.7.

In general, the largest scattered component generated by a plus alignment mark 34' is caused by the intersection with segment 33 of the reticle image 96 and is directed into the dark-field regions 60' and 66'. Dark-field region 66' collects the "right" scattered light, i.e. light scattered by the plus alignment mark 34' into the NA range between 0.35 to 0.70 in the direction 45 degrees (clockwise) from the positive x-direction indicated in FIG. 4. While dark-field region 60' collects the "left" scattered light, i.e. light scattered by the plus alignment mark 34' into the NA range between 0.35 to 0.70 in the direction 45 degrees (counter-clockwise) from the positive y-direction indicated in FIG. 4. Similarly, the largest scattered component generated by a minus alignment mark 34 is caused by the intersection with segment 31 of the reticle image 96 and is directed into the dark-field regions 62' and 64'. Dark-field region 62' collects the "right" scattered light, i.e. light scattered by the minus alignment mark into the NA range between 0.35 to 0.70 in the direction 45 degrees (counter-clockwise) from the positive x-direction indicated in FIG. 4. While dark-field region 64' collects the "left" scattered light, i.e. light scattered by the plus alignment mark into the NA range between 0.35 to 0.70 in the direction 45 degrees (clockwise) from the minus y-direction indicated in FIG. 4.

Referring to FIG. 5, there is an opaque region on the detection mask 54 from which no light is collected. It is between the central bright-field region 58' and the four outer dark-field regions 60', 62', 64', 66', and is referred to as the guard-band region 84. It is important for blocking unwanted light scattered or reflected from the layers covering the alignment marks 34, 34', which could be caused by shallow dips in the resist, for example. In this embodiment, the guard-band 84 corresponds to wafer 18 plane NA's between 0.25 to 0.35.

While this detection mask 54 geometry and associated detectors has been found to be simple and effective, other more complex masks that further divide the pupil plane could be implemented.

Illustrated Example of Alignment Signal Generation

Figure 6:
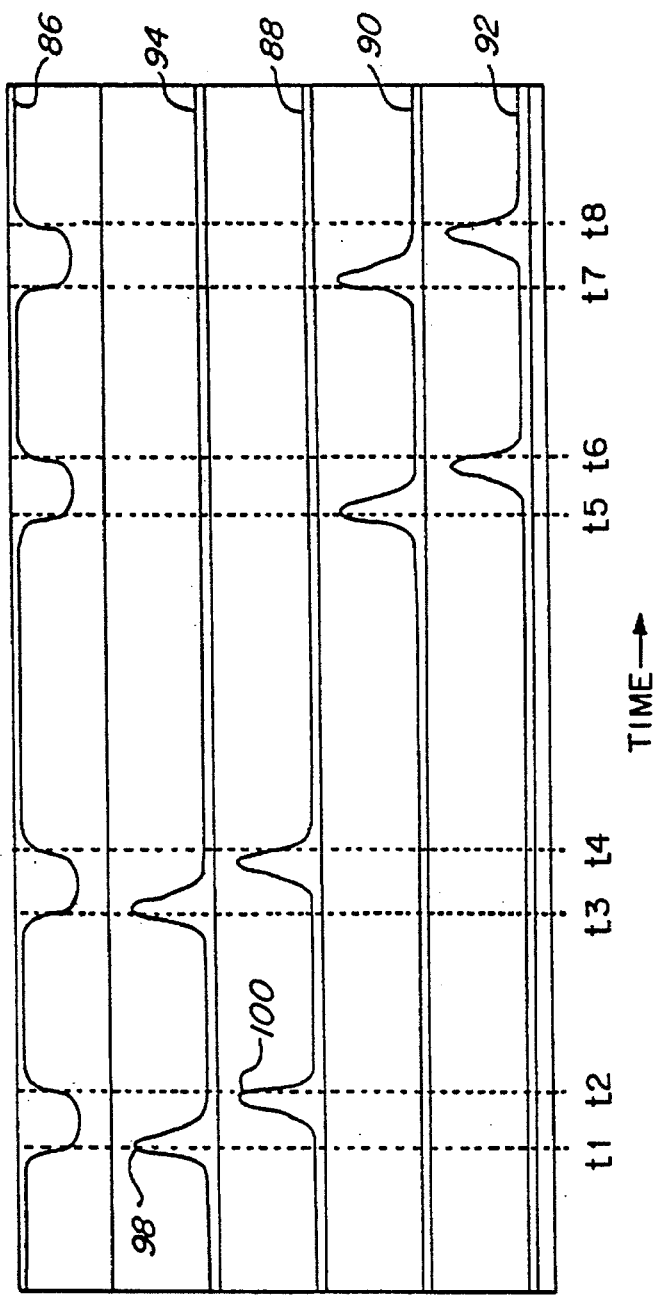
FIG. 6a–e is a chart illustrating an example of the alignment signals obtained by the present invention.

As the wafer is scanned at a constant velocity in the x direction as represented by arrow 82 shown in FIG. 4, alignment signals are generated. FIG. 6 is a chart illustrating an example of a sequence of signals. It should be emphasized that FIG. 6 is a schematic (i.e. not measured data) used as an example to clarify the alignment signal generation principle and is not meant only to be representative of the working case.

Figure 7:
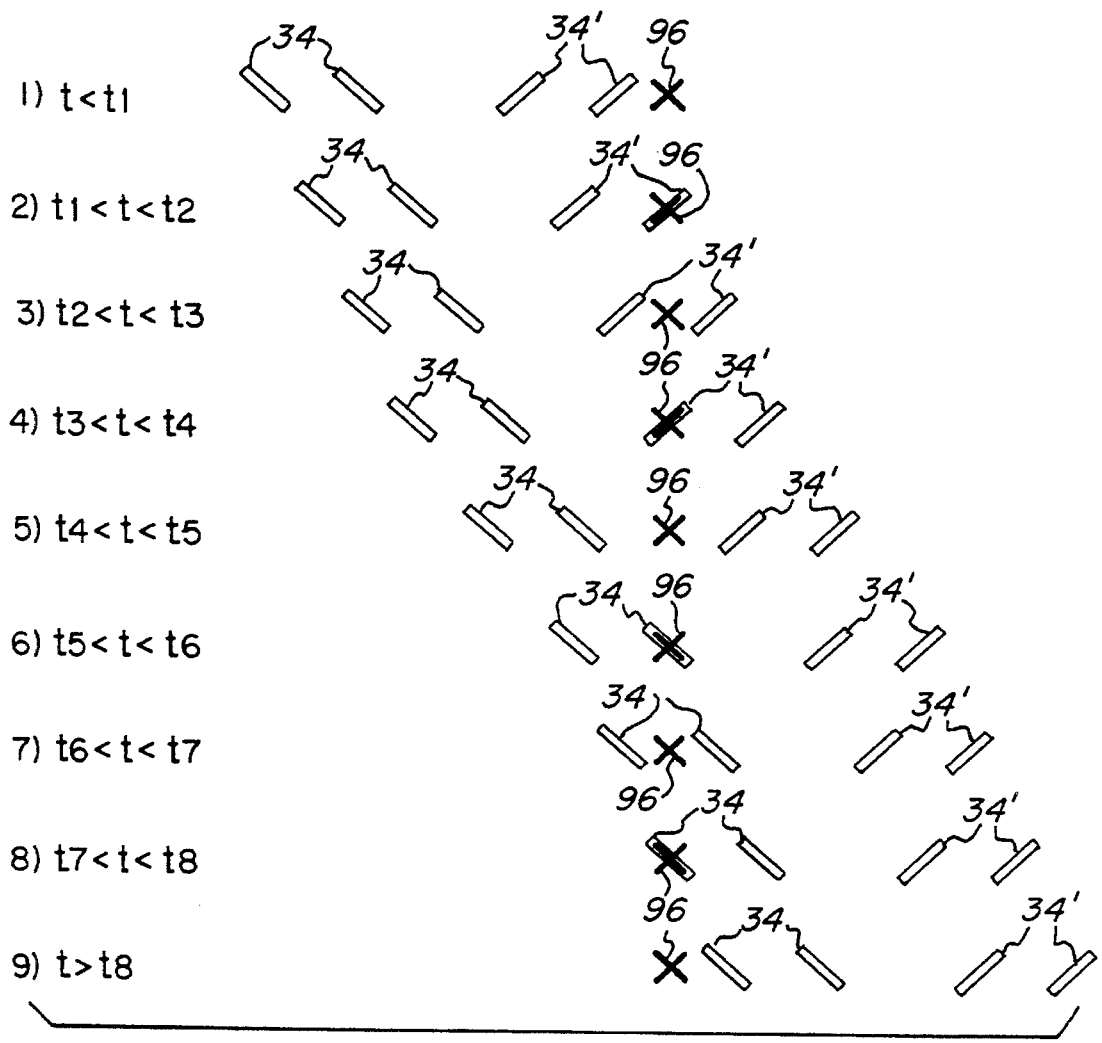
FIG. 7 is a pictorial representation of a wafer alignment scan illustrating the relationship of the wafer alignment marks to the alignment reticle image at particular intervals.

Each of the five graphs 86, 94, 88, 90, 92 illustrate the output of one of the detectors as a function of time during the wafer scan. It is important to note that, because the stage containing the wafer and the alignment marks is referenced in location and the alignment scan is at constant velocity, time can be converted to position. Therefore in the following description, time and space, (or location) can be used interchangeably. Graph 86 represents the output of the bright-field detector 58 while graphs 94, 88, 90 and 92 represent the output from the four dark-field detectors, 66, 60, 62 and 64 respectively. Referring to FIGS. 6 and 7, each of the graphs is marked vertically at specific times t1–t8 during the scan. Each one of these vertical demarcations occur at a time when the alignment reticle image 96 intersects a longitudinal edge of an alignment mark 34 or 34'. FIG. 7 is a pictorial representation of the wafer alignment marks 34 and 34' and the reticle image 96 at nine different time regions defined with respect to the eight time marks.

As the wafer alignment marks 34 and 34' scan from left to right relative to the projected alignment reticle image, light is reflected or scatter depending upon how the alignment marks intersect with the projected alignment reticle image 96.

In the time periods: t<t1, t2<t<t3, t4<t<t5, t6<t<t7, t>t8; the alignment marks 34' and 34 are not intersecting the reticle image 96. Therefore, there is not any scattered light. The bright-field signal 86 re, mains high while all dark-field signals 94, 88, 90, 92 remain low.

In the time periods: t1<t<t2 and t3<t<t4; a plus alignment mark 34' intersects the reticle image 96. Light is scattered out of the bright-field region 58' and into the plus right and left dark-field regions 66' and 60'. The bright-field signal 86 drops while the plus dark-field signals 94 and 88 rise. For this example, the leading edge of the alignment mark scatters light mostly into plus right dark-field region 66' while the trailing edge scatters mostly into the plus left dark-field region 60' causing the dark-field plus right signal 94 to peak before the dark-field left signal 83. The other two dark field signals 90 and 92 remain low.

In the time period: t5<t<t6 and t7<t<t8; a minus alignment mark 34 intersects the reticle image 96. Light is scattered out of the bright-field region 58' and into the minus right and left dark-field regions 62' and 64'. The bright-field signal 86 drops while the minus dark-field signals 90 and 92 rise. For this example, the leading edge of the alignment mark 34 scatters light mostly into the minus right dark-field region 62' while the trailing edge scatters mostly into the minus left dark-field region 64' causing the dark-field minus right signal 90 to peak before the dark-field left signal 92. The other two dark field signals 88 and 94 remain low.

Alignment Signal Analysis

The purpose of generating alignment signals is to determine the location of the alignment marks 34, 34' in wafer space. This can be accomplished by analyzing either the bright-field or dark-field signals, as shown in FIG. 6. As mentioned before, because the wafer 18 is scanned at a constant velocity, the time scale can be converted to position. Because the bright-field signals tend to be more process sensitive, the dark-field are generally preferred. The dark-field left and right signals from one alignment mark 34 or 34' tend to be generated by the alignment mark edges and are separated in time. The center of the alignment mark may be determined by considering both the left and right dark-field signals. For example, referring to FIGS. 6 and 7, the center of the leading alignment mark 34' can be determined by first finding the right signal peak 98 and left signal peak 100 separately and then averaging the two results. This gives the midpoint between the left and right signals and thus the center of the alignment mark 34'.

The main point to note is that the peaks of the left and right signals are determined separately and then the answers are combined. This method does not require the left and right signals be matched in amplitude to achieve the true center of the alignment marks 34, 34'. This alleviates the problem of matching (e.g. transmission matching) the separate optical paths involved in generating the left and right dark-field signals. It also provides a means for analyzing scattering asymmetries which could lead to process characterization.

It should be reiterated that assumptions were made to simplify the explanation of the signal generation depicted in FIGS. 6 and 7 and are not meant to represent the only conditions for which the invention will accurately find the position of alignment marks 34, 34'. In fact, the alignment system will be accurate under a variety of conditions, as long as the scattered light distribution of the image of the reticle 32 from each edge of the alignment marks 34, 34' generates left and right signals such that when the signals are analyzed separately and then averaged, the answer yields the true center of the alignment mark 34 or 34'.

Wafer Plane TV Monitor Viewing

Figure 8:
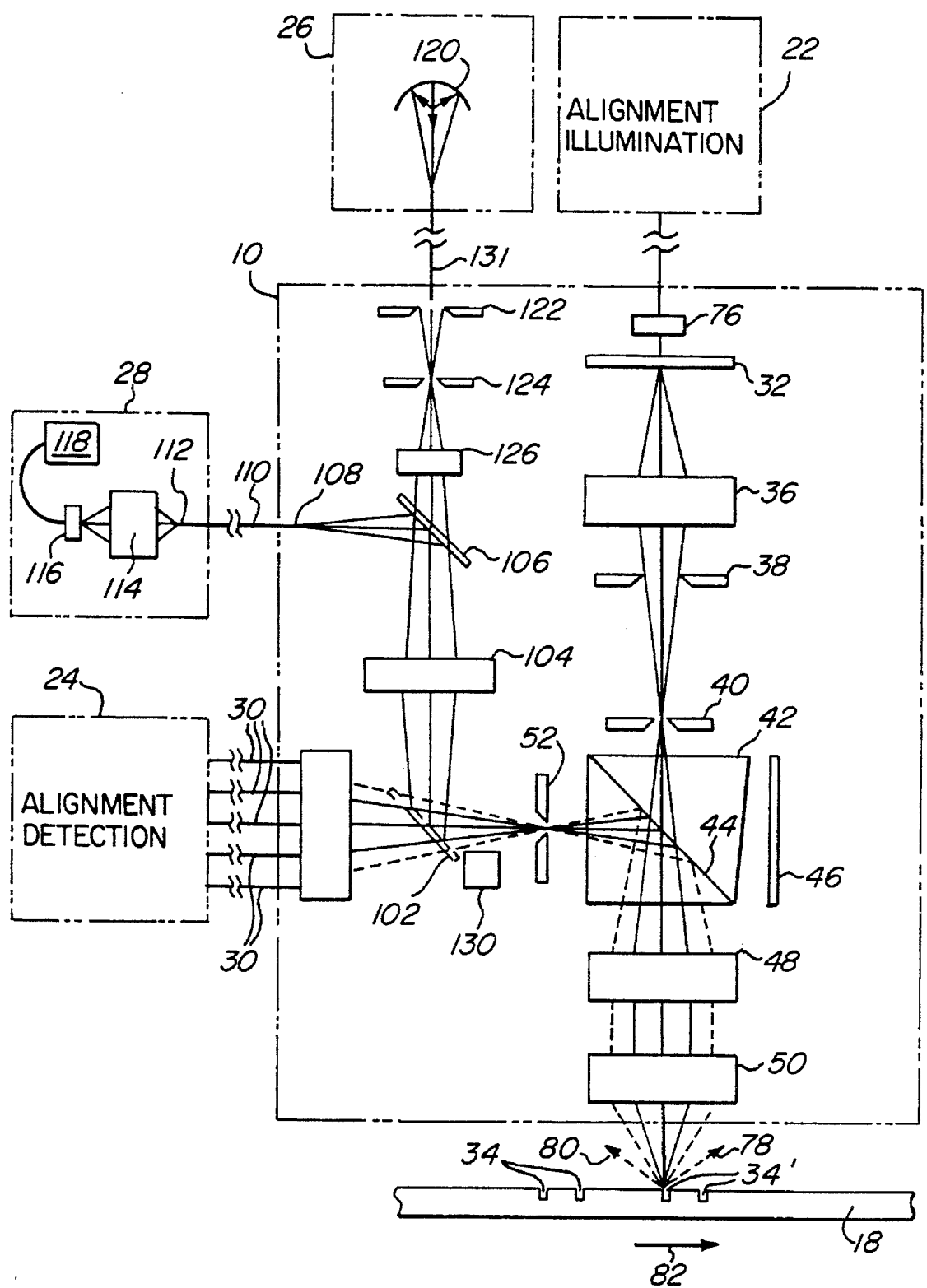
FIG. 8 is a schematic of the TV monitor, wafer image generation path of the present invention featuring the alignment sensor head, the camera illumination, and the CCD camera sub-systems.

At times there is a need to view the wafer. This could be for the purpose of manual intermediate alignment, for initial setup, or for visual wafer inspection. In the present invention, the device can be switched from automatic alignment mode which produces alignment signals to a manual mode which produces a TV monitor image of the wafer. FIG. 8 schematically illustrates the components used to produce the TV monitor image of the wafer. It includes the subsystems; alignment sensor head 10, the camera illumination 26, and the CCD camera 28.

The imaging path for producing the TV monitor wafer 18 image is as follows. Starting from the wafer 18 plane, light from the wafer 18 plane is collected by optics 50 and 48 and re-imaged to an intermediate image plane at which point there is a field stop 52. After the field stop 52, there is a mirror 102 that is flipped into position to intercept the light that would normally pass on to the detection mask 54 in automatic alignment mode. The light reflects off of the flip mirror 102, passes through optics 104, and reflects off of the plate beamsplitter 106 to the final image plane at the face 108 of the fiber image bundle 110.

The optics 50, 48 and 104 provide a magnification of approximately 16× from wafer 18 plane to the final image plane at the fiber image bundle face 108. The plate beamsplitter has a nominal broadband 50% transmissive 50% dielectric coating on the front surface and a broadband anti-reflection coating on its second surface to prevent a ghost image. The image bundle 110 is made up of a number of fibers coherently matched from end-to-end such that there is a 1:1 transfer of the image from the fiber face 108 at the alignment sensor head to the fiber face 112 at the CCD camera 28 subsystem. At the CCD camera 28 subsystem, optics 114 re-image the face 112 of the fiber image bundle 110 to the CCD detector array 116. The wafer 18 image is then transferred to a TV monitor 118. The TV camera wafer image has a resolution of 1 micron and a field-of-view of 150 microns. These limits are primarily driven by the number of resolution elements in the fiber image bundle 110.

Illumination is provided by the camera illumination subsystem 26. The camera illumination subsystems 26 consists of a commercially available filament lamp 120 which is spectrally filtered to deliver 'cool' visible light, i.e. no infrared. The light is delivered from the lamp 120 to the alignment sensor head 10 via a fiber optic bundle 131. The fiber optic bundle 131 is made up of a number of individual fibers randomly (incoherently) matched from end-to-end. Light emerges from the end of the fiber bundle 131 at the alignment sensor head 10 and passes through an aperture stop 122, a field stop 124, optics 126, and then the plate beamsplitter 106. From the plate beamsplitter 106, the light traverses the camera imaging path explained above to provide illumination at the wafer 18 plane.

The field stop 124 is conjugate to the wafer 18 plane and therefore to the front face 108 of the image fiber bundle 110. The light emerging from the incoherent fiber bundle 110 uniformly fills the field stop 124, thus providing uniform illumination at the wafer 18 plane and therefore a uniformly illuminated TV monitor 118 image. The size of the aperture stop 122 which is conjugate to the pupil of the camera imaging system sets the illumination partial coherence. To increase the time between lamp 120 changes, the lamp 120 is turned on only when needed. It is activated by the status of the flip mirror position sensor 130 so that the light is on only when the mirror 102 is flipped into position to provide the wafer 18 image.

What is claimed is:

1. An alignment system for use in a scanning photolithographic tool comprising:

an illumination source;

a reticle;

first lens means for directing light;

an aperture stop;

a beamsplitter;

second lens means for directing light to a wafer and for collecting light reflected and scattered from the wafer, the wafer having plus and minus alignment marks thereon;

first detector means, associated with said beamsplitter, for detecting light reflected from the wafer;

second detector means for detecting light scattered from the plus alignment mark on the wafer; and third detector means for detecting light scattered from the minus alignment mark on the wafer.

2. An alignment system as in claim 1 wherein:

said second detector means comprises a first left side scattered light detector and a first right side scattered light detector; and said third detector means comprises a second left side scattered light detector and a second right side scattered light detector.

3. An alignment system as in claim 1 wherein:

said reticle has two orthogonal intersecting rectangular apertures therein; and single alignment marks on the wafer are rectangular.

4. An alignment system as in claim 1 wherein:

said illumination source provides illumination over a broadband spectral range.

5. An alignment system as in claim 4 wherein:

the broadband spectral range is between 400 nanometers to 700 nanometers.

6. An alignment system as in claim 1 wherein:

said illumination source includes at least four different wavelengths of light spaced over a range greater than 100 nanometers.

7. An alignment system for use in a scanning photolithographic tool as used in semiconductor manufacturing comprising:

an illumination source;

a reticle;

first lens means for directing light;

an aperture stop;

a beamsplitter;

second lens means for directing light to a wafer and for collecting light reflected and scattered from the wafer, the wafer having plus and minus alignment marks thereon;

first detector means, associated with said beamsplitter and positioned to receive reflected light over a first predetermined numerical aperture, for detecting light reflected from the wafer;

second detector means, associated with said beamsplitter and positioned to receive scattered light over a second predetermined numerical aperture, for detecting light scattered from the plus alignment mark on the wafer;

third detector means, associated with said beamsplitter and positioned to receive scattered light over the second predetermined numerical aperture, for detecting light scattered from the minus alignment mark on the wafer; and guardband means, positioned between said first detector means and said second and third detector means, for preventing detection of unwanted scattered and reflected light.

8. An alignment system as in claim 7 wherein:

the first predetermined numerical aperture has a value smaller than the second predetermined numerical aperture.

9. An alignment system as in claim 7 wherein:

said second detector means comprises a first left side scattered light detector and a first right side scattered light detector; and said third detector means comprises a second left side scattered light detector and a second right side scattered light detector.

10. An alignment system as in claim 7 wherein:

said reticle has two orthogonal intersecting rectangular apertures therein; and single alignment marks on the wafer are rectangular.

11. An alignment system as in claim 7 wherein:
said illumination source provides illumination over a broadband spectral range.

12. An alignment system as in claim 11 wherein:
the broadband spectral range is between 400 nanometers to 700 nanometers.

13. An alignment system as in claim 7 wherein:
said illumination source includes at least four different wavelengths of light spaced over a range greater than 100 nanometers.

14. An alignment system for use in a scanning photolithographic tool as used in semiconductor manufacturing comprising:
an illumination source having a bandwidth ranging from 400 to 700 nanometers;
a reticle having two orthogonal intersecting rectangular apertures therein;
a first lens;
an aperture stop following said first lens to limit the numerical aperture of the light delivered to the wafer;
a beamsplitter positioned to receive light from said first lens;
an second lens positioned on a side of said beamsplitter opposite said first lens;
a wafer positioned adjacent said second lens;
a plurality of wafer alignment marks on said wafer comprised of both plus and minus orientations;
first detector means, associated with said beamsplitter and positioned to receive reflected light over a first predetermined numerical aperture, for detecting light reflected from said wafer and said plurality of wafer alignment marks;
first left side scattered light detector means, associated with said beamsplitter and positioned to receive scattered light over a second predetermined numerical aperture, for detecting light scattered into the left direction from the plus alignment mark orientation of said plurality of wafer alignment marks;
first right side scattered light detector means, associated with said beamsplitter and positioned to receive scattered light over the second predetermined numerical aperture, for detecting light scattered into the right direction from the plus alignment mark orientation of said plurality of wafer alignment marks;
second left side scattered light detector means, associated with said beamsplitter and positioned to receive scattered light over the second predetermined numerical aperture, for detecting light scattered into the left direction from the minus alignment mark orientation of said plurality of wafer alignment marks;
second right side scattered light detector means, associated with said beamsplitter and positioned to receive scattered light over the second predetermined numerical aperture, for detecting light scattered into the right direction from the minus alignment mark orientation of said plurality of wafer alignment marks; and
guardband means, positioned between said first detector means and said second and third detector means, for preventing detection of unwanted scattered and reflected light,
the first predetermined numerical aperture having a value less than the second predetermined numerical aperture.

15. A photolithographic tool comprising:
projection optics, said projection optics capable of projecting the image of a pattern onto a wafer, the wafer having a plurality of alignment marks formed thereon, including plus and minus alignment marks;
alignment optics attached adjacent to said projection optics, said alignment optics receiving alignment illumination from an illumination source, said alignment optics being independent of said projection optics so that the alignment illumination is not substantially collected by said projection optics;
a plurality of detectors receiving light scattered and reflected from the wafer and the plurality of alignment marks formed thereon and collected by said alignment optics, one of said plurality of detectors detecting light scattered from the plus alignment marks, and another one of said plurality of detectors detecting light scattered from the minus alignment marks,
whereby the wafer is aligned with the pattern by detection of light received by said plurality of detectors.

16. A photolithographic tool as in claim 15 wherein:
said projection optics image electromagnetic radiation in the ultraviolet wavelengths.

17. A photolithographic tool as in claim 15 wherein:
said alignment optics collect light scattered and reflected from the wafer in the wavelength range of 400 to 700 nanometers.

18. A photolithographic tool as in claim 17 further comprising:
an illumination source directing light through said alignment optics, said illumination source providing the equivalent to broadband radiation having at least four different wavelengths of light spaced over a range of not less than 100 nanometers.

19. A photolithographic tool as in claim 18 wherein:
said illumination source includes a laser.

20. A photolithographic tool as in claim 15 wherein:
one of said plurality of detectors detects reflected light, and one of said plurality of detectors detects scattered light.

21. A photolithographic tool as in claim 15 further comprising:
a TV camera for visually viewing the wafer, the plurality of wafer alignment marks, and a projected alignment reticle image.

22. A photolithographic tool as in claim 21 further comprising:
a movable mirror, said movable mirror being selectively positioned to direct light either to said plurality of detectors or to said TV camera.

23. A photolithographic tool comprising:
projection optics, said projection optics capable of projecting the image of a pattern onto a wafer, the wafer having a plurality of plus and minus alignment marks formed thereon;
alignment optics attached adjacent to said projection optics, said alignment optics receiving alignment illumination from an illumination source used to illuminate the wafer;
a first detector, said first detector positioned to receive the alignment illumination reflected from the wafer;

a second detector, said second detector positioned to receive the alignment illumination scattered from one of said plurality of plus alignment marks on the wafer; and a third detector, said third detector positioned to receive the alignment illumination scattered from one of said plurality of minus alignment marks on the wafer, whereby the wafer is aligned with the pattern by detection of light received by said first, second, and third detectors.

* * * * *